United States Patent [19]

Yokoi

[11] Patent Number: 5,530,356
[45] Date of Patent: Jun. 25, 1996

[54] METHOD AND APPARATUS FOR GENERATING MAGNETIC FIELDS FOR NUCLEAR MAGNETIC RESONANCE IMAGING WITH CROSS-TALK COMPENSATION

[75] Inventor: Motohisa Yokoi, Tochigiken, Japan

[73] Assignee: Kabushiki Kaisha Toshiba, Kawasaki, Japan

[21] Appl. No.: 543,743

[22] Filed: Oct. 16, 1995

Related U.S. Application Data

[63] Continuation of Ser. No. 93,783, Jul. 19, 1993, abandoned.

[30] Foreign Application Priority Data

Jul. 20, 1992 [JP] Japan .................................. 4-191207

[51] Int. Cl.[6] .................................................. G01R 33/28
[52] U.S. Cl. ............................................. 324/318; 324/307
[58] Field of Search .................................... 324/318, 309, 324/320, 322, 307, 300; 128/653.5

[56] References Cited

U.S. PATENT DOCUMENTS

| | | | |
|---|---|---|---|
| 4,585,995 | 4/1986 | Flugan | 324/322 |
| 4,647,858 | 3/1987 | Bottomley | 324/322 |
| 4,703,275 | 10/1987 | Holland | 324/318 |
| 4,924,186 | 5/1990 | Kawamoto et al. | 324/322 |
| 4,928,063 | 5/1990 | Lampson et al. | 324/307 |
| 4,965,521 | 10/1990 | Egloff | 324/312 |
| 4,978,919 | 12/1990 | Hinks | 324/313 |
| 5,150,055 | 9/1992 | Kimura | 324/322 |
| 5,227,728 | 7/1993 | Kaufman et al. | 324/318 |

Primary Examiner—Sandra L. O'Shea
Assistant Examiner—Raymond Y. Mah
Attorney, Agent, or Firm—Ronald L. Yin; Limbach & Limbach

[57] ABSTRACT

A generation of magnetic fields for a nuclear magnetic resonance imaging capable of preventing the occurrence of the cross-talk between coils for generating the magnetic fields easily. A coil system having a plurality of channels for generating magnetic fields is provided, and currents to drive the coil system is supplied from a power source. A controller generates the control signals indicating desired currents to be supplied from the power source to the coil system in an absence of cross-talks among the channels of the coil system, and then the cross-talks among the channels of the coil system are compensated by supplying the power source with cross-talk compensated control signals for controlling the currents to be supplied from the the power source to the coil system, where the cross-talk compensated control signals are obtained by adding the control signals with cross-talk compensation components derived according to predetermined cross-talk characteristics of the channels of the coil system.

14 Claims, 8 Drawing Sheets

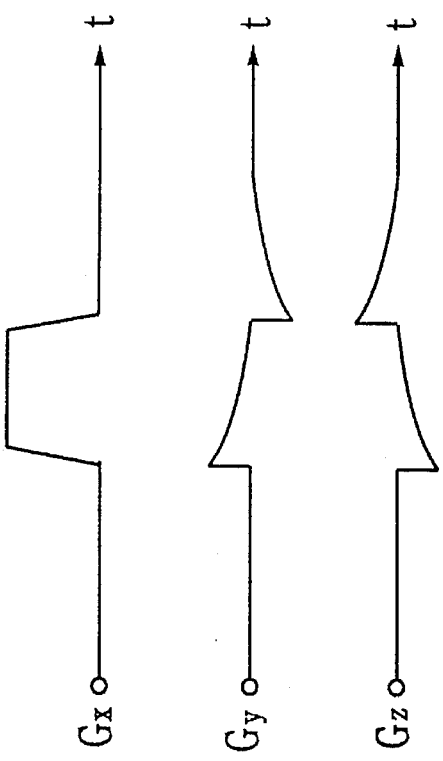
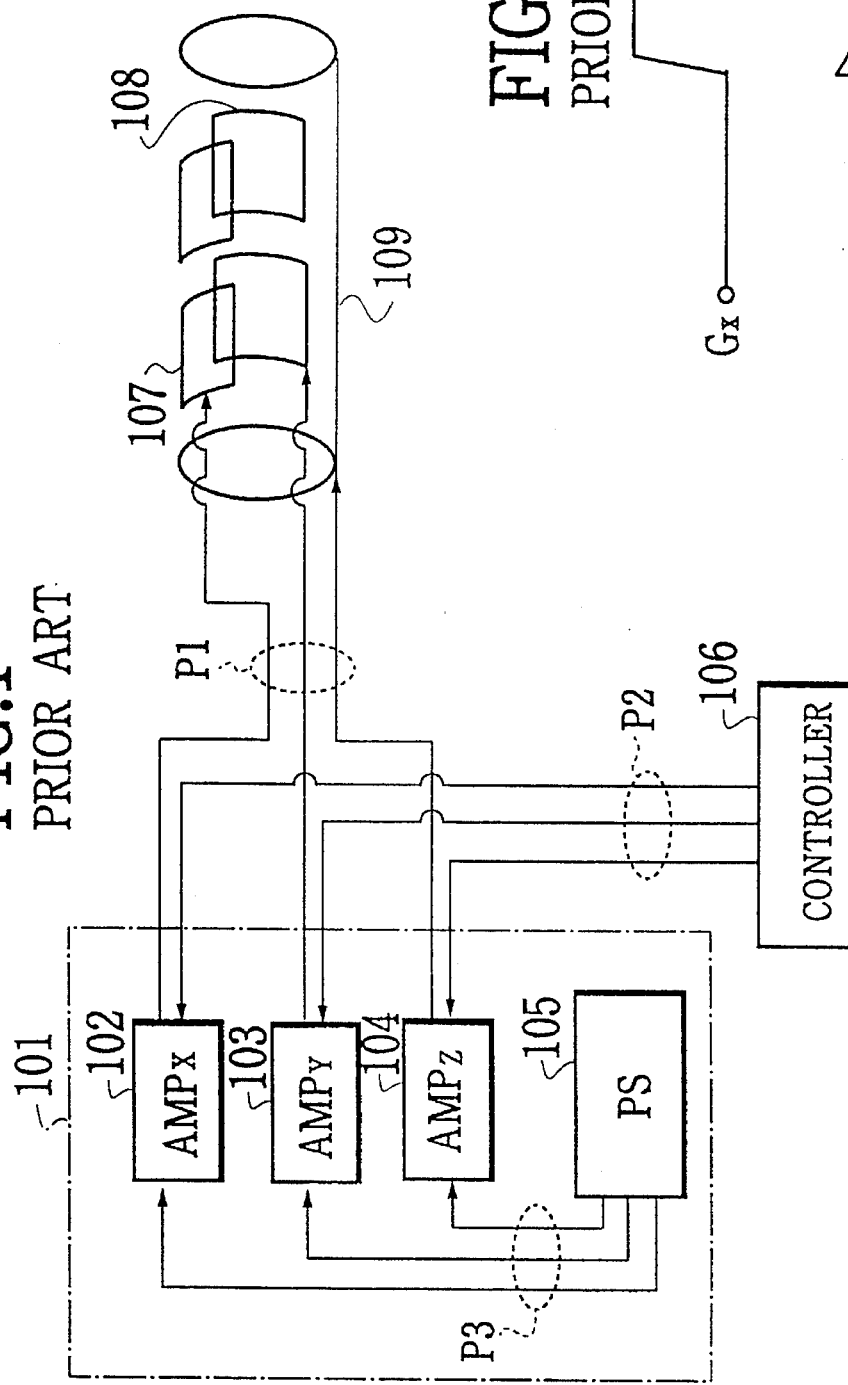

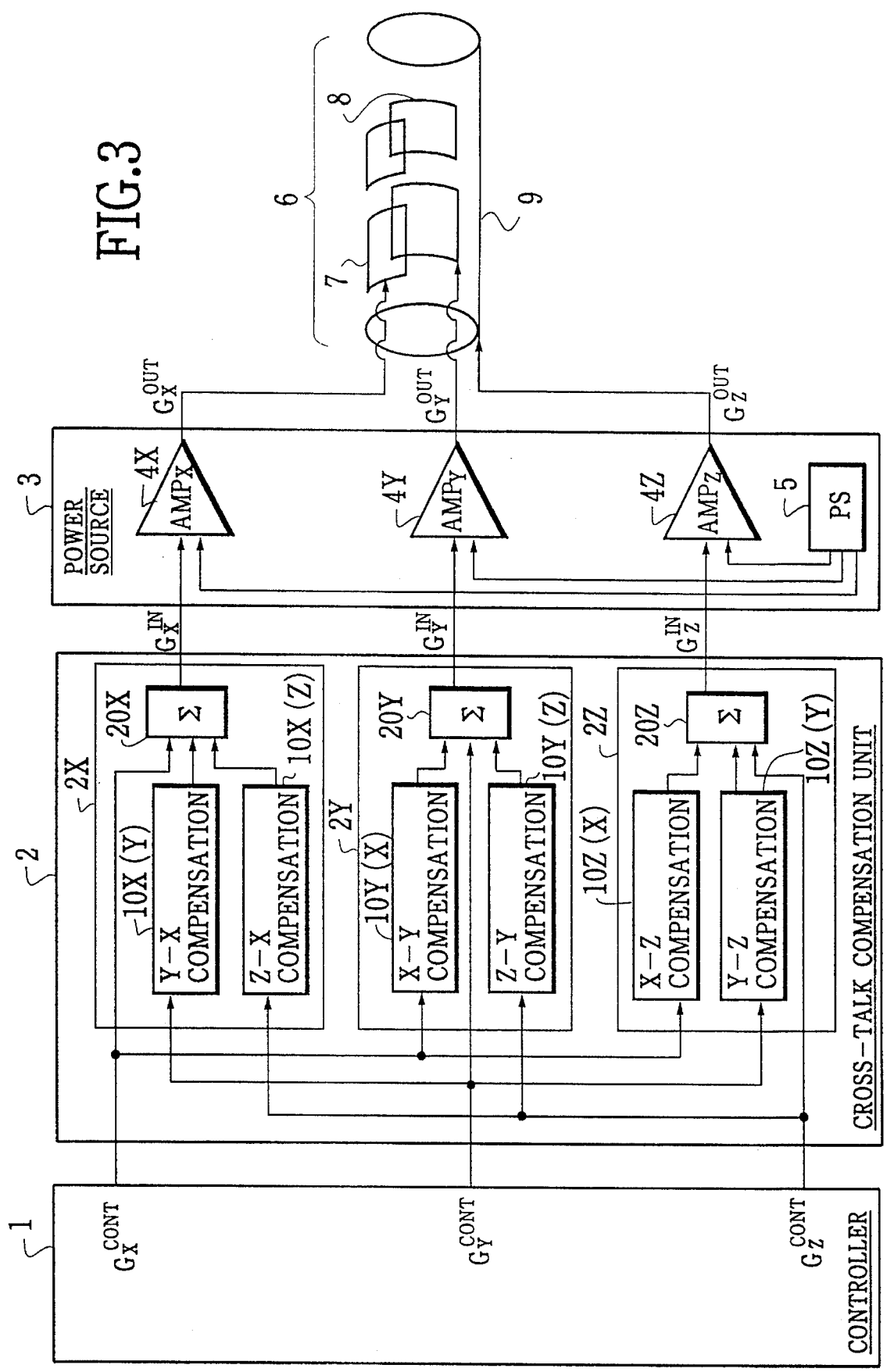

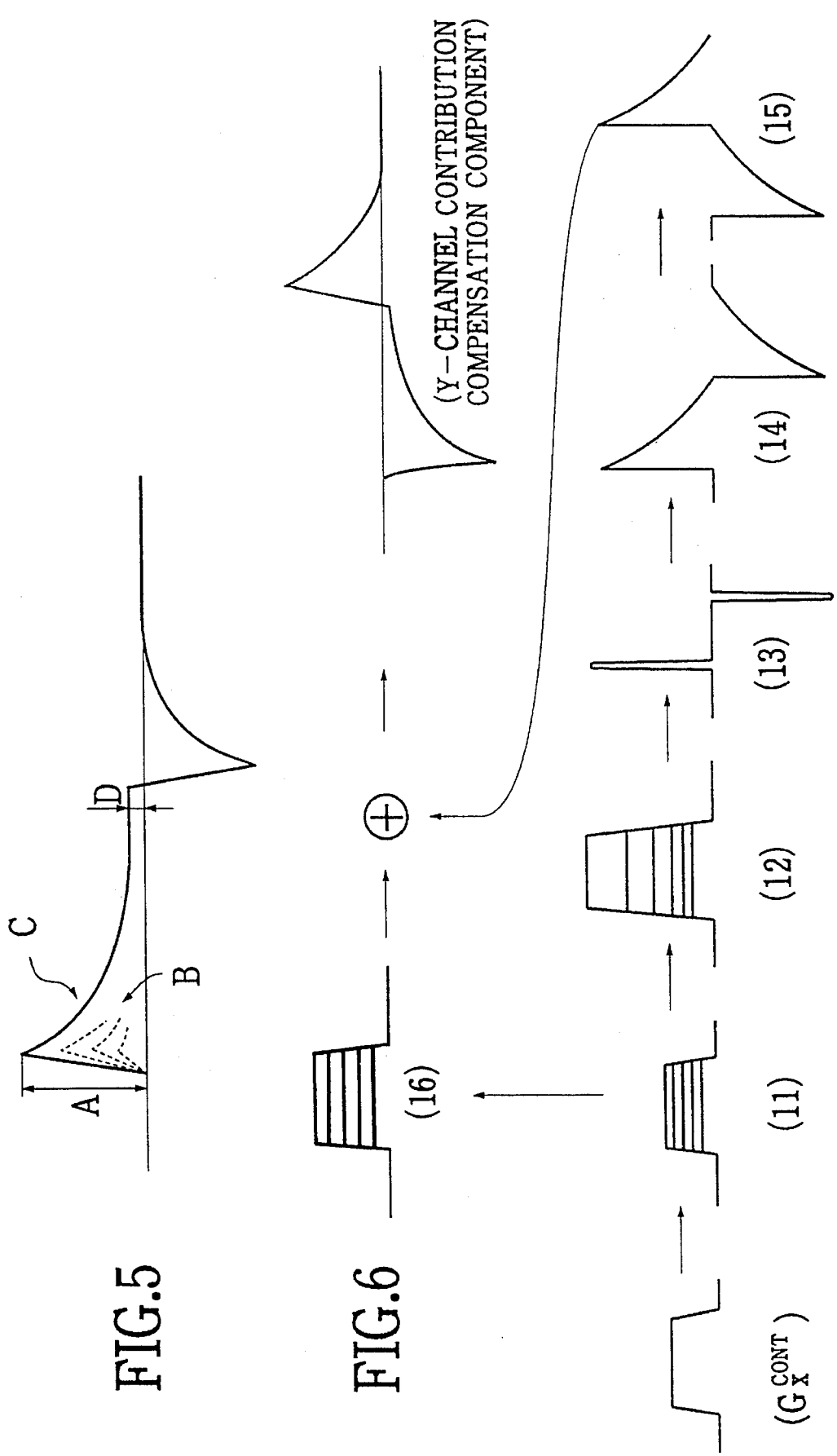

METHOD AND APPARATUS FOR GENERATING MAGNETIC FIELDS FOR NUCLEAR MAGNETIC RESONANCE IMAGING WITH CROSS-TALK COMPENSATION

This is a continuation of application Ser. No. 08/093,783, filed on Jul. 19, 1993 (now abandoned).

BACKGROUND OF THE INVENTION

1. Field of the Invention

The present invention relates to a generation of magnetic fields for a nuclear magnetic resonance imaging, and more particularly, to a prevention of a cross-talk between coils used in the generation of magnetic fields.

2. Description of the Background Art

In general, in an NMR (Nuclear Magnetic Resonance) imaging apparatus, a desired pulse sequence is executed by generating gradient magnetic fields in x, y, and z directions by supplying prescribed amounts of currents to gradient magnetic field coils from a gradient magnetic field power source. Usually, the current to be supplied to each gradient magnetic field coil amounts to 150 to 200 A, so that there arises a cross-talk between the gradient magnetic field coils for generating gradient magnetic fields in different directions.

More specifically, a conventional apparatus for generating gradient magnetic fields in the NMR imaging apparatus has a configuration as shown in FIG. 1, which comprises: the gradient magnetic field toll system including an X-axis gradient magnetic field coil 107, a Y-axis gradient magnetic field coil 108, and a Z-axis gradient magnetic field coil 109; and the gradient magnetic field power source 101 including an X-channel amplifier ($AMP_x$) 102 for outputting the current to be supplied to the X-axis gradient magnetic field coil 107, a Y-channel amplifier ($AMP_y$) 103 for outputting the current to be supplied to the Y-axis gradient magnetic field coil 108, a Z-channel amplifier ($AMP_z$) 104 for outputting the current to be supplied to the Z-axis gradient magnetic field coil 109 and a power source unit (PS) 105 for supplying necessary electric power to each of the amplifiers 102, 103, and 104; where the operations of the amplifiers 102, 103, and 104 are controlled by a controller 106 of the NMR imaging apparatus.

In this configuration of FIG. 1, the amplifiers 102, 103, and 104 are controlled to output the prescribed amounts of currents by the controller 106 according to the desired pulse sequence, such that the desired gradient magnetic fields can be generated by the gradient magnetic field coils 107, 108, and 109. Here, in this configuration of FIG. 1, cables for transmitting currents are provided in close proximity with each other at positions P1, P2, and P3 indicated in FIG. 1, so that the cross-talk can be caused between any two of the gradient magnetic field coils 107, 108, and 109.

Namely, when only an X-channel is supplied with the current having a waveform as indicated by $G_x$ in FIG. 2 while no current is supplied to Y- and Z-channels, for example, the currents having waveforms as indicated by $G_y$ and $G_z$ in FIG. 2 flow through the Y- and Z-channels, respectively, due to the influence of the current supplied to the X-channel. This is a phenomenon which has been known as the cross-talk. Note that the similar cross-talk can be caused in the X- and Z-channels when the current is supplied only to the Y-channel, or in the X- and Y-channels when the current is supplied only to the Z-channel.

Here, it is to be noted such a cross-talk can be caused by a coupling among cables as well as a coupling among coils. The cross-talk due to the coupling among cables can be prevented to some extent by shielding the cables and distancing the cables from each other, but such a measure is not applicable to the cross-talk due to the coupling among coils.

Thus, in a conventional gradient magnetic field power source used in the NMR imaging apparatus, the cross-talk is caused between the gradient magnetic field coils, and such a cross-talk can severely affect the encoding control or the phase control in a pulse sequence requiring a high precision such as that for the NMR angiography.

It is also to be noted that the similar problem of the cross-talk explained above for the gradient magnetic field coil system also arises in the shim coil system and the static magnetic field coil system, as well as among the static magnetic field coil system, the gradient magnetic field coil system, and the shim coil system.

SUMMARY OF THE INVENTION

It is therefore an object of the present invention to provide a method and an apparatus for generating magnetic fields in a nuclear magnetic resonance imaging apparatus capable of preventing the occurrence of the cross-talk between coils for generating the magnetic fields easily.

According to one aspect of the present invention there is provided an apparatus for generating magnetic fields for a nuclear magnetic resonance imaging, comprising: coil means having a plurality of channels for generating magnetic fields; power source means for supplying currents to drive the coil means; controller means for generating control signals indicating desired currents to be supplied from the power source means to the coil means in an absence of cross-talks among said plurality of channels of the coil means; and compensation means for compensating the cross-talks among said plurality of channels of the coil means by supplying the power source means with cross-talk compensated control signals for controlling the currents to be supplied from the power source means to the coil means, the cross-talk compensated control signals being obtained by adding the control signals generated by the control means with cross-talk compensation components derived according to predetermined cross-talk characteristics of said plurality of channels of the coil means.

According to another aspect of the present invention there is provided a method of generating magnetic fields for a nuclear magnetic resonance imaging, comprising the steps of: providing coil means having a plurality of channels for generating magnetic fields; supplying currents to drive the coil means from power source means; generating control signals indicating desired currents to be supplied from the power source means to the coil means in an absence of cross-talks among said plurality of channels of the coil means; and compensating the cross-talks among said plurality of channels of the coil means by supplying the power source means with cross-talk compensated control signals for controlling the currents to be supplied from the the power source means to the coil means, the cross-talk compensated control signals being obtained by adding the control signals with cross-talk compensation components derived according to predetermined cross-talk characteristics of said plurality of channels of the coil means.

Other features and advantages of the present invention will become apparent from the following description taken in conjunction with the accompanying drawings.

BRIEF DESCRIPTION OF THE DRAWINGS

FIG. 1 is a schematic diagram of a conventional apparatus for generating gradient magnetic fields in the NMR imaging apparatus.

FIG. 2 is a diagram showing a waveform of current supplied to an X-channel and waveforms of the cross-talk caused in Y- and Z-channels by the X-channel.

FIG. 3 is a schematic diagram of a first embodiment of apparatus for generating magnetic fields in the NMR imaging apparatus according to the present invention.

FIG. 5 is a waveform diagram of a measured waveform of the cross-talk component in the cross-talk compensation unit adjustment operation in the apparatus of FIG. 3.

FIG. 6 is a sequential waveform diagram of waveforms produced at elements of each compensation circuit in the cross-talk compensation unit of the apparatus of FIG. 3.

DETAILED DESCRIPTION OF THE PREFERRED EMBODIMENTS

Figure 4:
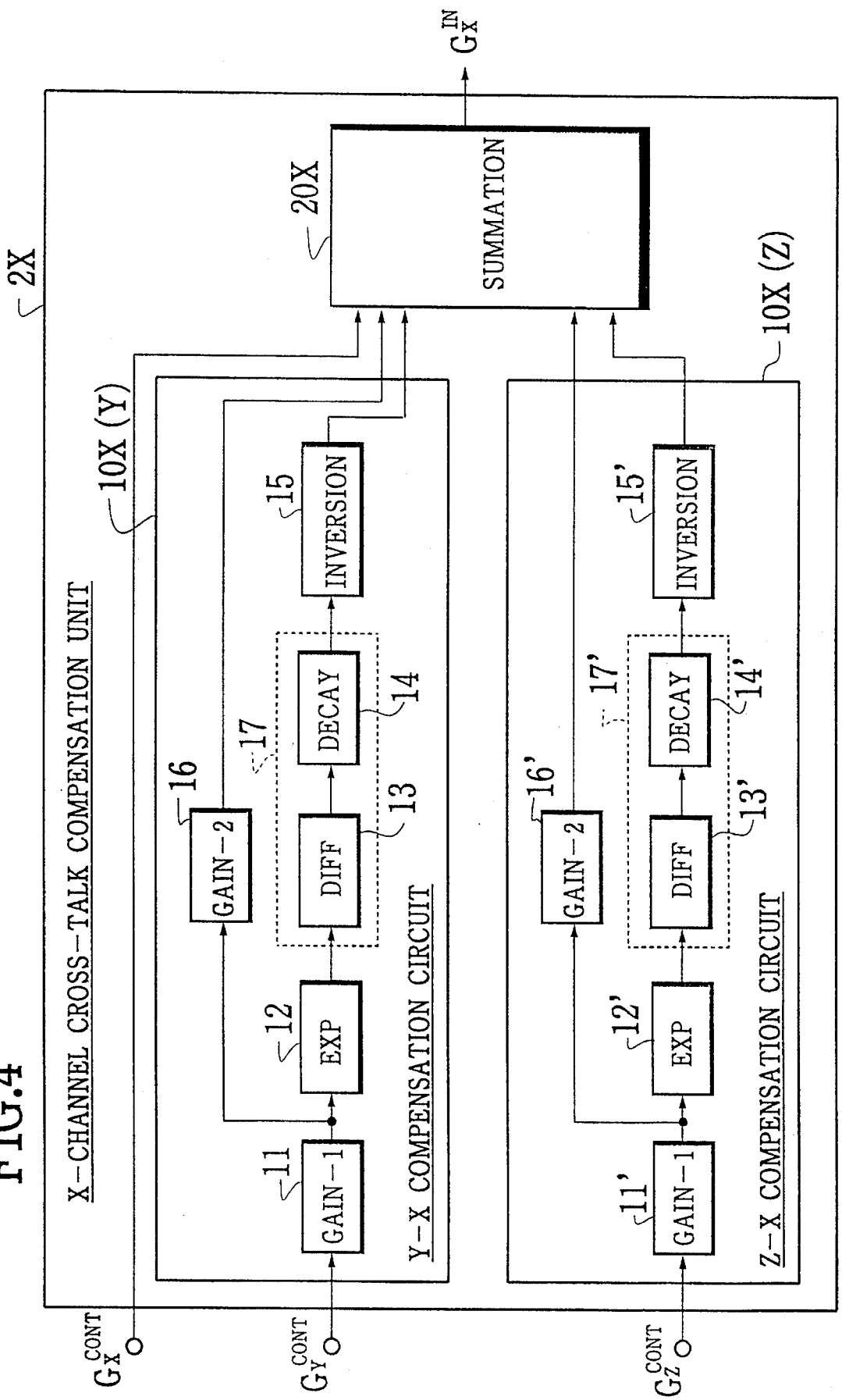
FIG. 4 is a block diagram of an X-channel cross-talk compensation unit in the cross-talk compensation unit of the apparatus of FIG. 3.

Referring now to FIG. 3, a first embodiment of the apparatus for generating magnetic fields according to the present invention will be described in detail, for an exemplary case of gradient magnetic fields.

In this embodiment, the apparatus generally comprises: a gradient magnetic field call system 6 including X-axis gradient magnetic field coils 7, Y-axis gradient magnetic field calls 8, and Z-axis gradient magnetic field coils 9; a gradient magnetic field power source 3 including an X-channel amplifier (AMP$_x$) 4X for outputting the current to be supplied to the X-axis gradient magnetic field coils 7, a Y-channel amplifier (AMP$_y$) 4Y for outputting the current to be supplied to the Y-axis gradient magnetic field coils 8, a Z-channel amplifier (AMP$_z$) 4Z for outputting the current to be supplied to the Z-axis gradient magnetic field coils 9, and a power source unit (PS) 5 for supplying necessary electric power to each of the amplifiers 4X, 4Y, and 4Z; a controller 1 for generating control signals $G_x^{CONT}$, $G_y^{CONT}$, and $G_z^{CONT}$ indicating desired amounts of currents to be supplied from the gradient magnetic field power source 3 to the gradient magnetic field coil system 6 in an absence of the cross-talks among the gradient magnetic field calls 7, 8, and 9; and a cross-talk compensation unit 2, connected between the controller 1 and the gradient magnetic field power source 3, including an X-channel cross-talk compensation unit 2X for supplying an X-channel cross-talk compensated input signal $G_x^{IN}$ to the X-channel amplifier 4X, a Y-channel cross-talk compensation unit 2Y for supplying a Y-channel cross-talk compensated input signal $G_y^{IN}$ to the Y-channel amplifier 4Y, and a Z-channel cross-talk compensation unit 2Z for supplying a Z-channel cross-talk compensated input signal $G_z^{IN}$ to the Z-channel amplifier 4Z.

As shown in FIG. 3, the X-channel cross-talk compensation unit 2X comprises a Y-X compensation circuit 10X(Y) for generating a Y-channel contribution compensation component for cancelling the cross-talk of the X-channel due to the Y-channel according to the Y-channel control signal $G_y^{CONT}$, a Z-X compensation circuit 10X(Z) for generating a Z-channel contribution compensation component for cancelling the cross-talk of the X-channel due to the Z-channel according to the Z-channel control signal $G_z^{CONT}$, and a summation circuit 20X for summing the Y-channel contribution compensation component, the Z-channel contribution compensation component, and the X-channel control signal $G_x^{CONT}$ to obtain the X-channel cross-talk compensated input signal $G_x^{IN}$ to be supplied to the X-channel amplifier 4X.

Similarly, the Y-channel cross-talk compensation unit 2Y comprises an X-Y compensation circuit 10Y(X) for generating an X-channel contribution compensation component for cancelling the cross-talk of the Y-channel due to the X-channel according to the X-channel control signal $G_x^{CONT}$, a Z-Y compensation circuit 10Y(Z) for generating a Z-channel contribution compensation component for cancelling the cross-talk of the Y-channel due to the Z-channel according to the Z-channel control signal $G_z^{CONT}$, and a summation circuit 20Y for summing the X-channel contribution compensation component, the Z-channel contribution compensation component, and the Y-channel control signal $G_y^{CONT}$ to obtain the Y-channel cross-talk compensated input signal $G_y^{IN}$ to be supplied to the Y-channel amplifier 4Y.

Similarly, the Z-channel cross-talk compensation unit 2Z comprises an X-Z compensation circuit 10Z(X) for generating an X-channel contribution compensation component for cancelling the cross-talk of the Z-channel due to the X-channel according to the X-channel control signal $G_x^{CONT}$, a Y-Z compensation circuit 10Z(Y) for generating a Y-channel contribution compensation component for cancelling the cross-talk of the Z-channel due to the Y-channel according to the Y-channel control signal $G_y^{CONT}$, and a summation circuit 20Z for summing the X-channel contribution compensation component, the Y-channel contribution compensation component, and the Z-channel control signal $G_z^{CONT}$ to obtain the Z-channel cross-talk compensated input signal $G_z^{IN}$ to be supplied to the Z-channel amplifier 4Z.

In further detail, the Y-X compensation circuit 10X(Y) in the X-channel cross-talk compensation unit 2X has a configuration as shown in FIG. 4, which comprises: a first gain circuit (GAIN-1) 11 for applying a gain control operation on the Y-channel control signal $G_y^{CONT}$, an exponential circuit (EXP) 12 for applying an exponential operation on the output of the first gain circuit 11, a differentiation circuit (DIFF) 13 for differentiating the output of the exponential circuit 12, a decay circuit 14 for applying a decay operation on the output of the differentiation circuit 13, an inversion circuit 15 for inverting the output of the decay circuit 14, and a second gain circuit (GAIN-2) 16 for applying a gain control operation on the output of the first gain circuit 11.

Also, as shown in FIG. 4, the Z-X compensation circuit 10X(Z) in the X-channel cross-talk compensation unit 2X has a configuration substantially similar to that of the Y-X compensation circuit 10X(Y) described above (corresponding elements are labelled by the same reference numerals with dash marks (') attached in FIG. 4), and the summation circuit 20X sums the outputs of the inversion circuit 15 and the second gain circuit 16 of the Y-X compensation circuit 10X(Y) constituting the Y-channel contribution compensation component, the outputs of the inversion circuit 15' and the second gain circuit 16' of the Z-X compensation circuit 10X(Z) constituting the Z-channel contribution compensation component, and the X-channel control signal $G_x^{CONT}$, so as to obtain the X-channel cross-talk compensated input signal $G_x^{IN}$ to be supplied to the X-channel amplifier 4X.

It is also to be noted here that, although not shown in the drawings, each of the X-Y compensation circuit 10Y(X) and the Z-Y compensation circuit 10Y(Z) in the Y-channel cross-talk compensation unit 2Y as well as the X-Z compensation circuit 10Z(X) and the Y-Z compensation circuit 10Z(Y) in the Z-channel cross-talk compensation unit 2Z has a configuration substantially similar to that of the Y-X compensation circuit 10X(Y) described above.

Now, with references to FIGS. 5 and 6, the operation of this first embodiment of the apparatus for generating magnetic fields shown in FIG. 3 will be described in detail.

First, the X-channel control signal $G_x^{CONT}$ is set to be in a waveform as indicated by $G_x$ in FIG. 2, while the Y-channel control signal $G_y^{CONT}$ and the Z-channel control signal $G_z^{CONT}$ are set equal to zero by the controller 1, such that the cross-talk in forms of the currents having waveforms as indicated by $G_y$ and $G_z$ in FIG. 2 can be caused in the Y- and Z-channels due to the influence of the current supplied to the X-channel as described above, and these control signals $G_x^{CONT}$, $G_y^{CONT}$, and $G_z^{CONT}$ are supplied as they are to the X-, Y-, and Z-channel amplifiers 4X, 4Y, and 4Z, without making any cross-talk compensation operation by the cross-talk compensation unit 2, in order to measure the actual cross-talk in forms of the currents having waveforms as indicated by $G_y$ and $G_z$ in FIG. 2 in the Y- and Z-channels, respectively.

Then, in each of the Y- and Z-channels, the measured waveform is analyzed as shown in FIG. 5, to obtain an initial peak amplitude A, an other channel dependency factor B indicating a relative size of the cross-talk, a decaying time constant C, and an offset D as compensation circuit parameters.

Then, the parameter settings of the circuits of the X-Y compensation circuit 10Y(X) in the Y-channel cross-talk compensation unit 2Y are adjusted according to the compensation circuit parameters obtained from the measured waveform in the Y-channel as follows. Namely, the gain factor of the gain control operation to be applied by the first gain circuit 11 is set according to the initial peak amplitude A while the gain factor of the gain control operation to be applied by the second gain circuit 16 is set according to the offset D, and the exponential factor of the exponential operation to be applied by the exponential circuit 12 is set according to the other channel dependency factor C while a decaying factor of the decay operation to be applied by the decay circuit 14 is set according to the decaying time constant C.

In addition, whether to carry out an inversion at the inversion circuit 15 or not is determined according to a polarity of the measured waveform indicating a positive cross-talk as in a case of Gy shown in FIG. 2 in which case the inversion at the inversion circuit 15 is to be carried out and a negative cross-talk as in a case of Gz shown in FIG. 2 in which case the inversion at the inversion circuit 15 is not to be carried out. Thus, in this example, the inversion is to be carried out in the X-Y compensation circuit 10Y(X) in the Y-channel cross-talk compensation unit 2Y.

Similarly, the parameter settings of the circuits of the X-Z compensation circuit 10Z(X) in the Z-channel cross-talk compensation unit 2Z are adjusted according to the compensation circuit parameters obtained from the measured waveform in the Z-channel. In this example, the inversion is not to be carried out in the X-Z compensation circuit 10Z(X) in the Z-channel cross-talk compensation unit 2Z.

In the similar manner, the Y-channel control signal $G_y^{CONT}$ is set to be in a waveform as indicated by $G_x$ in FIG. 2, while the X-channel control signal $G_x^{CONT}$ and the Z-channel control signal $G_z^{CONT}$ are set equal to zero by the controller 1, such that the cross-talk in forms of the currents having waveforms as indicated by $G_y$ and $G_z$ in FIG. 2 can be caused in the X- and Z-channels due to the influence of the current supplied to the Y-channel, and these control signals $G_x^{CONT}$, $G_y^{CONT}$, and $G_z^{CONT}$ are supplied as they are to the X-, Y-, and Z-channel amplifiers 4X, 4Y, and 4Z, without making any cross-talk compensation operation by the cross-talk compensation unit 2, in order to measure the actual cross-talk in forms of the currents having waveforms as indicated by $G_y$ and $G_z$ in FIG. 2 in the X- and Z-channels, respectively. Then, in each of the X- and Z-channels, the measured waveform is analyzed as shown in FIG. 5 to obtain the initial peak amplitude A, the other channel dependency factor B, the decaying time constant C, and the offset D as the compensation circuit parameters, and the parameter settings of the circuits of the Y-X compensation circuit 10X(Y) in the X-channel cross-talk compensation unit 2X are adjusted according to the compensation circuit parameters obtained from the measured waveform in the X-channel, while the parameter settings of the circuits of the Y-Z compensation circuit 10Z(Y) in the Z-channel cross-talk compensation unit 2Z are adjusted according to the compensation circuit parameters obtained from the measured waveform in the Z-channel.

Also, in the similar manner, the Z-channel control signal $G_z^{CONT}$ is set to be in a waveform as indicated by $G_x$ in FIG. 2, while the X-channel control signal $G_x^{CONT}$ and the Y-channel control signal $G_y^{CONT}$ are set equal to zero by the controller 1, such that the cross-talk in forms of the currents having waveforms as indicated by $G_y$ and $G_z$ in FIG. 2 can be caused in the X- and Y-channels due to the influence of the current supplied to the Z-channel, and these control signals $G_x^{CONT}$, $G_y^{CONT}$, and $G_z^{CONT}$ are supplied as they are to the X-, Y-, and Z-channel amplifiers 4X, 4Y, and 4Z, without making any cross-talk compensation operation by the cross-talk compensation unit 2, in order to measure the actual cross-talk in forms of the currents having waveforms as indicated by $G_y$ and $G_z$ in FIG. 2 in the X- and Y-channels, respectively. Then, in each of the X- and Y-channels, the measured waveform is analyzed as shown in FIG. 5 to obtain the initial peak amplitude A, the other channel dependency factor B, the decaying time constant C, and the offset D as the compensation circuit parameters, and the parameter settings of the circuits of the Z-X compensation circuit 10X(Z) in the X-channel cross-talk compensation unit 2X are adjusted according to the compensation circuit parameters obtained from the measured waveform in the X-channel, while the parameter settings of the circuits of the Z-Y compensation circuit 10Y(Z) in the Y-channel cross-talk compensation unit 2Y are adjusted according to the compensation circuit parameters obtained from the measured waveform in the Y-channel.

By this cross-talk compensation unit adjustment operation, it becomes possible for the X-channel cross-talk compensation unit 2X to supply the X-channel cross-talk compensated input signal $G_x^{IN}$ to the X-channel amplifier 4X, the Y-channel cross-talk compensation unit 2Y to supply the Y-channel cross-talk compensated input signal $G_y^{IN}$ to the Y-channel amplifier 4Y, and the Z-channel cross-talk compensation unit 2Z to supply the Z-channel cross-talk compensated input signal $G_z^{IN}$ to the Z-channel amplifier 4Z, as each of the X-, Y-, and Z-channel cross-talk compensation units 2X, 2Y, and 2Z operates as follows.

Namely, in the X-Y compensation circuit 10Y(X) of the Y-channel cross-talk compensation unit 2Y for example, when the control signal in a form of $(G_x^{CONT})$ of FIG. 6 is entered into the first gain circuit 11, the first gain circuit 11 applies the gain control operation with the gain factor equal to the measured initial peak amplitude A on the entered control signal to produce the output signal in a form of (11) of FIG. 6, and then the exponential circuit 12 applies exponential operation with the exponential factor equal to the measured other channel dependency factor B on the output signal of the first gain circuit 11 to produce the output signal in a form of (12) of FIG. 6. Next, the differentiation circuit 13 differentiates the output signal of the exponential circuit 12 to produce the output signal in a form of (13) of FIG. 6, and then the decay circuit 14 applies the decay operation with the decaying factor equal to the measured decaying time constant C on the output signal of the differentiation circuit 13 to produce the output signal in a form of (14) of FIG. 6. Then, when the inversion is to be carried out, the inversion circuit 15 inverts the output signal of the decay circuit 14 to produce the output signal in a form of (15) of FIG. 6, whereas when the inversion is not to be carried out, the inversion circuit 15 outputs the output signal of the decay circuit 14 as it is. Meanwhile, the second gain circuit 16 applies the gain control operation with the gain factor equal to the measured offset D on the output signal of the first gain circuit 11 to produce the output signal in a form of (16) of FIG. 6.

As a result, when the output signals of the inversion circuit 15 and the second gain circuit 16 are added together in the summation circuit 20Y, the Y-channel contribution compensation component in a form of (Y-channel contribution compensation component) of FIG. 6 can be obtained, which can exactly cancel the Y-channel cross-talk component in a form of FIG. 5.

The other compensation circuits in the X-, Y-, and Z-channel cross-talk compensation units 2X, 2Y, and 2Z operates similarly, to produce the appropriate compensation components.

Thus, when the summation circuit 20X in the X-channel cross-talk compensation unit 2X sums the outputs of the inversion circuit 15 and the second gain circuit 16 of the Y-X compensation circuit 10X(Y) constituting the Y-channel contribution compensation component, the outputs of the inversion circuit 15' and the second gain circuit 16' of the Z-X compensation circuit 10X(Z) constituting the Z-channel contribution compensation component, and the X-channel control signal $G_x^{CONT}$, the X-channel cross-talk compensated input signal $G_x^{IN}$ in which the Y- and Z-channel cross-talk components are removed can be supplied from the summation circuit 20X of the X-channel cross-talk compensation unit 2X to the X-channel amplifier 4X, such that the X-channel amplifier 4X can supply the desired amplified output signal $G_x^{OUT}$, which is free of the cross-talk and in accordance with the original X-channel control signal $G_x^{CONT}$, to the X-axis gradient magnetic field coils 7.

The Y- and Z-channel cross-talk compensation units 2Y and 2Z operates similarly, such that the Y- and Z-channel amplifiers 4Y and 4Z can supply the desired amplified output signals $G_y^{OUT}$ and $G_z^{OUT}$, which are free of the cross-talk and in accordance with the original Y- and Z-channel control signals $G_y^{CONT}$ and $G_z^{CONT}$, to the Y- and Z-axis gradient magnetic field coils 8 and 9, respectively.

Thereafter, in the actual operation of the NMR imaging apparatus, the controller 1 generates the desired X-, Y-, and Z-channel control signals $G_x^{CONT}$, $G_y^{CONT}$, and $G_z^{CONT}$ according to the desired pulse sequence to be carried out, and in response, by the operation of the cross-talk compensation unit 2 as described above, the X-, Y-, and Z-channel amplifiers 4X, 4Y, and 4Z supply the desired amplified output signals $G_x^{OUT}$, $G_y^{OUT}$, and $G_z^{OUT}$, which are free of the cross-talk and in accordance with the original X-, Y-, and Z-channel control signals $G_x^{CONT}$, $G_y^{CONT}$, and $G_z^{CONT}$, to the X-, Y-, and Z-axis gradient magnetic field coils 7, 8, and 9, respectively.

Figure 7:
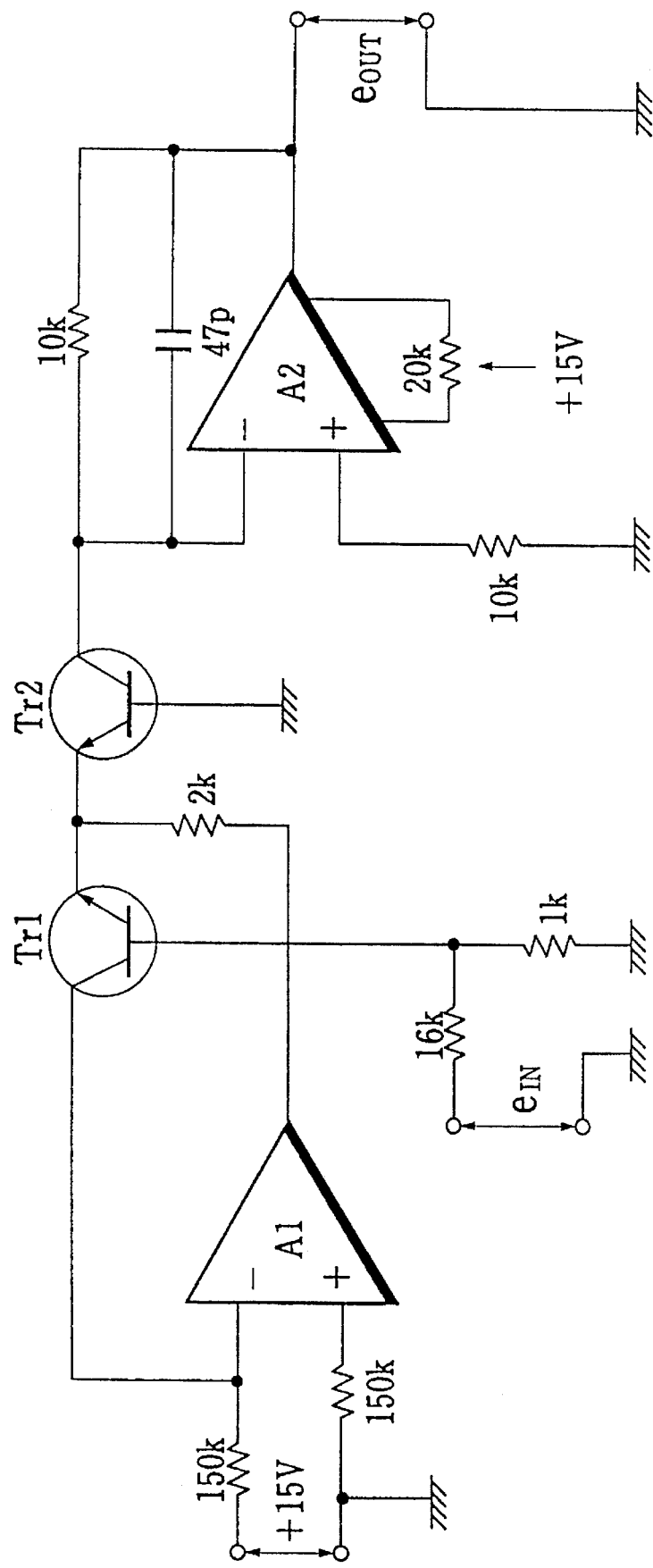
FIG. 7 is an exemplary circuit configuration for an exponential circuit in each compensation circuit in the cross-talk compensation unit of the apparatus of FIG. 3.

It is to be noted that, in each compensation circuit, the exponential circuit 12 can be formed in a configuration of a known exponential operation circuit using amplifiers, transistors, registers, and a capacitor, as shown in FIG. 7, which can carry out the exponential operation expressed by the following equation (1).

$$e_{out} = 10 \exp(-e_{in}) \quad (1)$$

Figure 8:
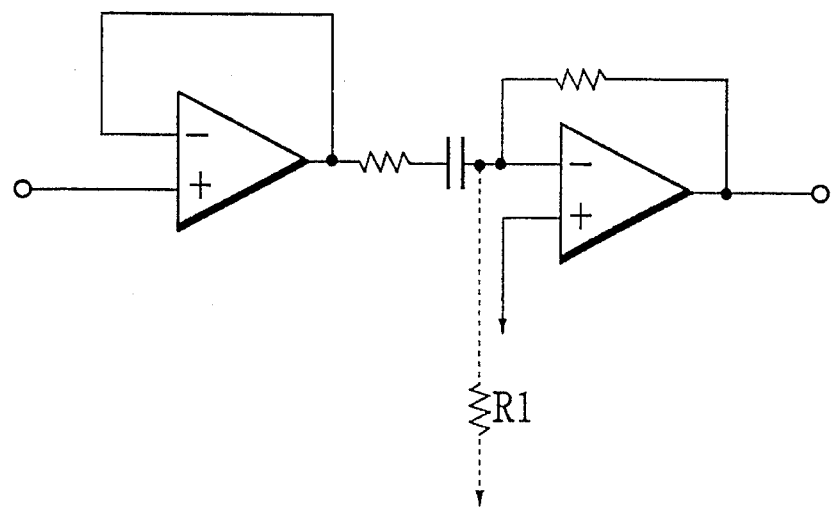
FIG. 8 is an exemplary circuit configuration for a differentiation circuit and a decay circuit in each compensation circuit in the cross-talk compensation unit of the apparatus of FIG. 3.

On the other hand, in each compensation circuit, the differentiation circuit 13 can be formed in a configuration of a known differentiation operation circuit using amplifiers, registers, and a capacitor, as shown in FIG. 8. In addition, by incorporating a register R1 to this differentiation operation circuit as indicated in FIG. 8, a circuit 17 in FIG. 4 combining the differentiation circuit 13 and the decay circuit 14 can be provided by the entire circuit of FIG. 8.

Figure 9:
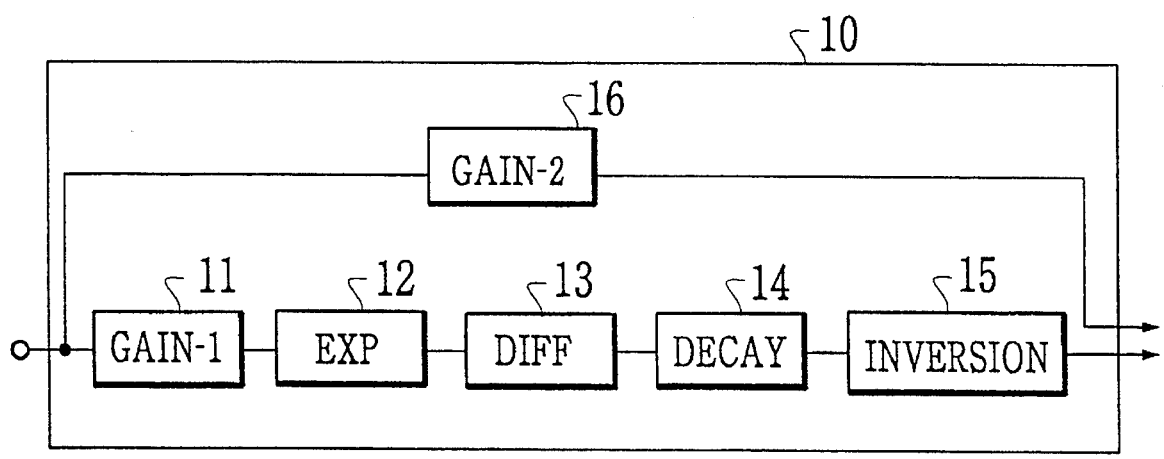
FIG. 9 is an alternative configuration for each compensation circuit in the cross-talk compensation unit of the apparatus of FIG. 3.

It is also to be noted that, in each compensation circuit, the second gain circuit 16 may be connected to the input side of the first gain circuit 11 as shown in FIG. 9 instead of the output side of the first gain circuit 11 as in FIG. 4, by appropriately setting the gain factor of the gain control operation at the second gain circuit 16.

It is also to be noted that, in the first embodiment described above, the effect of the cross-talk compensation may be verified after the cross-talk compensation unit adjustment operation, and the cross-talk compensation unit adjustment operation and this verification of the effect of the cross-talk compensation may be carried out iteratively for the further fine adjustment, until the satisfactory cross-talk compensation can be verified, if desired.

It is also to be noted that, the compensation circuits in the cross-talk compensation unit 2 may be supplied with the outputs of the amplifiers 4X, 4Y, and 4Z for the respective channels instead of the control signals $G_x^{CONT}$, $G_y^{CONT}$, and $G_z^{CONT}$ for the respective channels as described above, by appropriately accounting for the gain factor of the amplifiers 4X, 4Y, and 4Z at the first gain circuit 11, if desired.

Thus, according to this first embodiment, it becomes possible to provide the apparatus for generating magnetic fields for a nuclear magnetic resonance imaging capable of preventing the occurrence of the cross-talk between coils for generating the magnetic fields easily, and therefore it becomes possible to accurately carry out the encoding control or the phase control in a pulse sequence requiring a high precision such as that for the NMR angiography.

Figure 10:
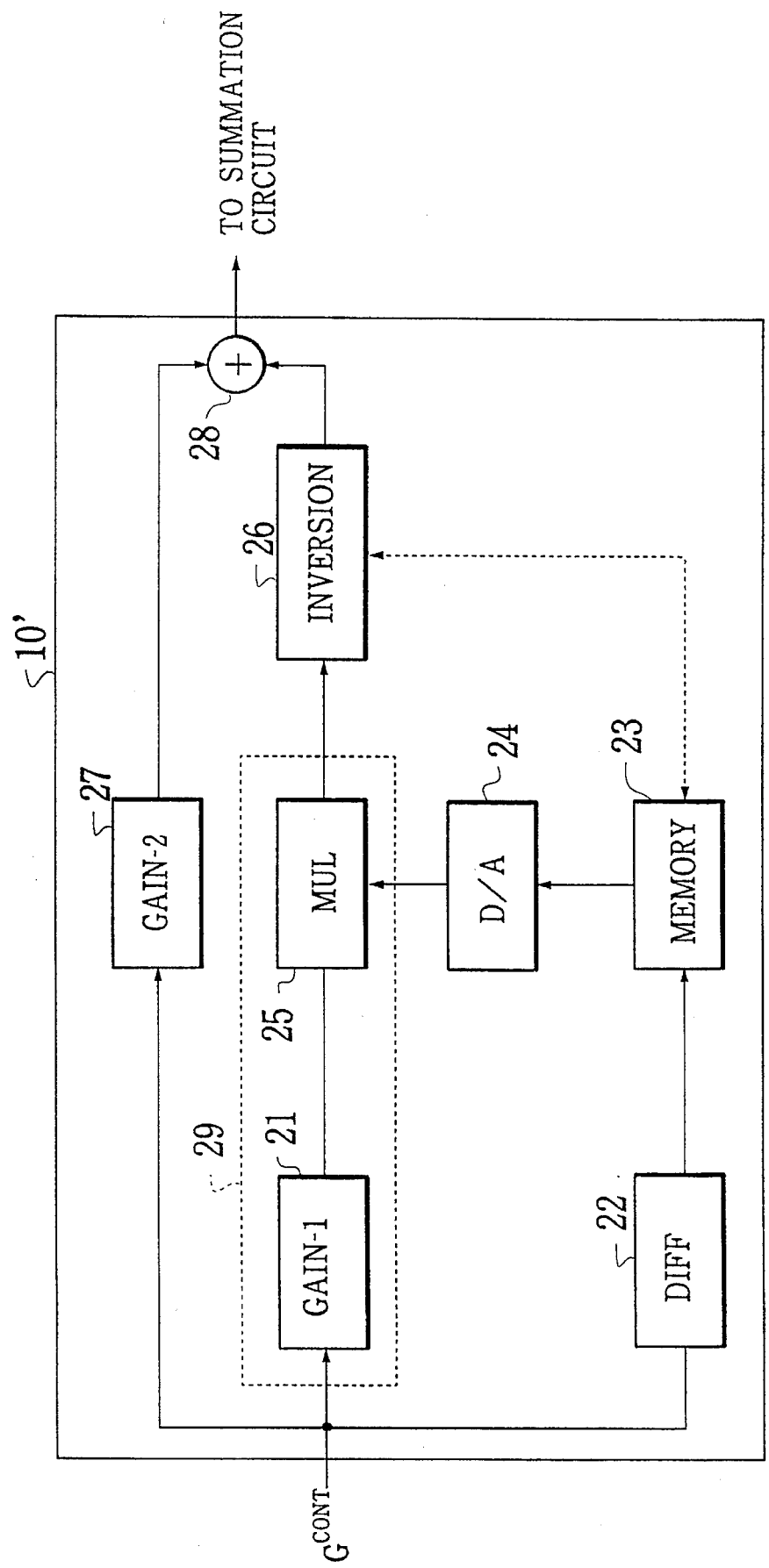
FIG. 10 is a block diagram of a compensation circuit to be used in the cross-talk compensation unit of the second embodiment of apparatus for generating magnetic fields in the NMR imaging apparatus according to the present invention.

Referring now to FIG. 10, a second embodiment of the apparatus for generating magnetic fields according to the present invention will be described in detail.

In this second embodiment, each compensation circuit 10 used in the first embodiment described above is to be replaced by the compensation circuit 10' shown in FIG. 10, which comprises: a first gain circuit (GAIN-1) 21 for applying a gain control operation on the entered control signal $G^{CONT}$, a differentiation circuit (DIFF) 22 for differentiating the entered control signal $G^{CONT}$ to obtain a trigger signal, a memory 23 for storing the cross-talk component waveform measured, sampled, and A/D converted in advance, a D/A converter 24 for D/A converting the cross-talk component waveform read out from the memory 23 at a timing of the trigger signal, a multiplication circuit (MUL) 25 for multiplying the output of the first gain circuit 21 with the D/A converted cross-talk component waveform obtained by the D/A converter 24, an inversion circuit 26 for inverting the output of the multiplication circuit 25, a second gain circuit (GAIN-2) 27 for applying a gain control operation on the entered control signal $G^{CONT}$, and an adder 28 for adding the outputs of the inversion circuit 26 and the second gain circuit 27.

In this second embodiment, instead of obtaining the compensation circuit parameters by the measurement of the actual cross-talk used in the first embodiment described above, for each channel, the actual cross-talk is caused by using the control signals similar to those used in the cross-talk compensation unit adjustment operation in the first embodiment, and the measured cross-talk component waveform itself is sampled, A/D converted, and stored in digital form in the memory 23. At this point, the appropriate gain factors for the gain control operations to be carried out by the first and second gain circuits 21 and 27 are also determined according to the measured cross-talk component waveform, and the first and second gain circuits 21 and 27 are accordingly calibrated.

Then, in the X-Y compensation circuit 10Y(X) of the Y-channel cross-talk compensation unit 2Y for example, when the control signal in a form of ($G_x^{CONT}$) of FIG. 6 is entered into the first gain circuit 21, the first gain circuit 21 applies the gain control operation with a first gain factor set by the calibration on the entered control signal to produce the output signal in a form similar to that of (11) of FIG. 6, while the differentiation circuit 22 differentiates the entered control signal to produce the output signal in a form similar to that of (13) of FIG. 6, where the initial peak of this output signal is subsequently used as the trigger signal for triggering the read out of the cross-talk component waveform from the memory 23.

Then, the stored cross-talk component waveform in digital form is read out from the memory 23 at a timing of the trigger signal, and D/A converted by the D/A converter 24 to recover the analog form similar to that of FIG. 5, and multiplied with the output signal of the first gain circuit 21 by the multiplication circuit 25 to produce the output signal in a form similar to that of (14) of FIG. 6. Then, the inversion circuit 26 inverts the output signal of the multiplication circuit 25 to produce the output signal in a form similar to that of (15) of FIG. 6, while the second gain circuit 27 applies the gain control operation with a second gain factor set by the calibration on the entered control signal to produce the output signal in a form similar to that of (16) of FIG. 6. Finally, the output signals of the inversion circuit 26 and the second gain circuit 27 are added together by the adder 28 to produce the Y-channel contribution compensation component to be supplied to the summation circuit 20Y, in a form similar to that of (Y-channel contribution compensation component) of FIG. 6 which can exactly cancel the Y-channel cross-talk component in a form of FIG. 5, Just as in the first embodiment described above.

The other compensation circuits in the X-, Y-, and Z-channel cross-talk compensation units 2X, 2Y, and 2Z operates similarly, to produce the appropriate compensation components.

Thereafter, in the actual operation of the NMR imaging apparatus, the controller 1 generates the desired X-, Y-, and Z-channel control signals $G_x^{CONT}$, $G_y^{CONT}$, and $G_z^{CONT}$ according to the desired pulse sequence to be carried out, and in response, by the operation of the compensation circuits of a form shown in FIG. 10 in the cross-talk compensation unit 2 as described above, the X-, Y-, and Z-channel amplifiers 4X, 4Y, and 4Z supply the desired amplified output signals $G_x^{OUT}$, $G_y^{OUT}$, and $G_z^{OUT}$, which are free of the cross-talk and in accordance with the original X-, Y-, and Z-channel control signals $G_x^{CONT}$, $G_y^{CONT}$, and $G_z^{CONT}$, to the X-, Y-, and Z-axis gradient magnetic field coils 7, 8, and 9, respectively, Just as in the first embodiment described above.

It is to be noted that, in this second embodiment, the first gain circuit 21 and the multiplication circuit 25 can be provided as an integrally formed circuit 29 as indicated in FIG. 10.

It is also to be noted that, in this second embodiment, the memory 23 may store the cross-talk component waveform in inverted form in advance, in which case the inversion operation by the inversion circuit 26 becomes unnecessary so that the memory 23 may produce a signal to control the inversion circuit 26 to not to apply the inversion operation as indicated in FIG. 10.

Thus, it should be obvious that, according to this second embodiment, it also becomes possible to provide the apparatus for generating magnetic fields for a nuclear magnetic resonance imaging capable of preventing the occurrence of the cross-talk between coils for generating the magnetic fields easily, and therefore it becomes possible to accurately carry out the encoding control or the phase control in a pulse sequence requiring a high precision such as that for the NMR angiography, just as in the first embodiment described above.

Figure 11:
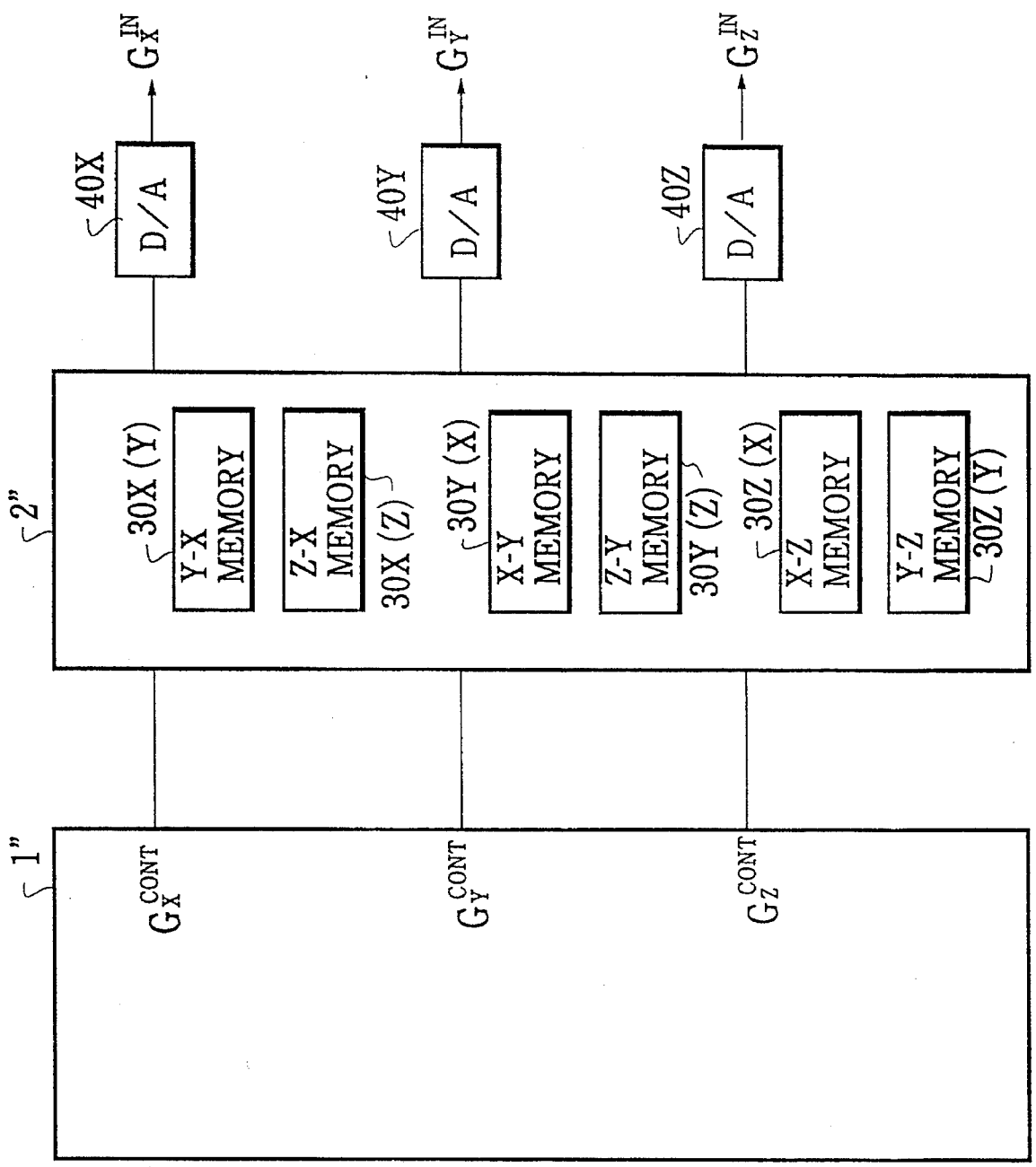
FIG. 11 is a schematic diagram of a third embodiment of apparatus for generating magnetic fields in the NMR imaging apparatus according to the present invention.

Referring now to FIG. 11, a third embodiment of the apparatus for generating magnetic fields according to the present invention will be described in detail.

In this third embodiment, each compensation circuit 10' used in the second embodiment described above is to be replaced by a memory 30 which stores the cross-talk compensation component such as that obtained by the compensation circuit 10' of the second embodiment in advance, in digital form.

In this third embodiment, in the actual operation of the NMR imaging apparatus, the controller 1" generates the desired X-, Y-, and Z-channel control signals $G_x^{CONT}$, $G_y^{CONT}$, and $G_z^{CONT}$ in digital form according to the desired pulse sequence to be carried out, and in response, by adding the entered control signal for each channel with the associated cross-talk compensation components stored in the memories 30 in the cross-talk compensation unit 2", and then D/A converting the output of the cross-talk compensation unit 2" by the D/A converters 40X, 40Y, and 40Z provided between the cross-talk compensation unit 2" and the power source (not shown in FIG. 11) similar to that shown in FIG. 3, the X-, Y-, and Z-channel amplifiers 4X, 4Y, and 4Z supply the desired amplified output signals $G_x^{OUT}$, $G_y^{OUT}$, and $G_z^{OUT}$, which are free of the cross-talk and in accordance with the original X-, Y-, and Z-channel control signals $G_x^{CONT}$, $G_y^{CONT}$, and $G_z^{CONT}$, to the X-, Y-, and Z-axis gradient magnetic field coils 7, 8, and 9, respectively, just as in the first and second embodiments described above.

It is to be noted here that, in this third embodiment, the entire cross-talk compensation unit 2" can be provided integrally in a form of a micro-processor having memory functions.

Thus, it should be obvious that, according to this third embodiment, it also becomes possible to provide the apparatus for generating magnetic fields for a nuclear magnetic resonance imaging capable of preventing the occurrence of the cross-talk between coils for generating the magnetic fields easily, and therefore it becomes possible to accurately carry out the encoding control or the phase control in a pulse sequence requiring a high precision such as that for the NMR angiography, just as in the first and second embodiments described above.

It is to be noted that the embodiments described above for the gradient magnetic field coil system can be applied similarly to the shim coil system or the static magnetic field coil system, or all of the static magnetic field coil system, the gradient magnetic field coil system, and the shim coil system together.

It is also to be noted that, in the embodiments described above, the detailed configuration of each compensation circuit, such as that of the first embodiment shown in FIGS. 4 and 9 and that of the second embodiment shown in FIG. 10, corresponds to the exemplary cross-talk component waveform in forms of Gy or Gz shown in FIG. 2, which is the typical coupling waveform. However, in a case the cross-talk component waveform substantially differs from such a typical coupling waveform, the detailed configuration of each compensation circuit to produce the cross-talk compensation component that can cancel the cross-talk component may be modified accordingly.

It is further to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. An apparatus for generating magnetic fields for a nuclear magnetic resonance imaging, comprising:

coil means having a plurality of channels for generating magnetic fields;

power source means for supplying currents to drive the coil means;

controller means for generating control signals indicating desired currents to be supplied from the power source means to the coil means in an absence of cross-talks among said plurality of channels of the coil means;

compensation circuit for compensating for the cross-talks among said plurality of channels of the coil means by supplying the power source means with cross-talk compensated control signals for controlling the currents to be supplied from the power source means to the coil means, the cross-talk compensated control signals being obtained by adding the control signals generated by the control means with cross-talk compensation component signals derived according to predetermined cross-talk characteristics of said plurality of channels of the coil means;

said compensation circuit including a compensation component generation circuit for generating the cross-talk compensation component signals by obtaining an inversion of cross-talk component waveforms for the cross-talks among said plurality of channels of the coil means measured in advance;

an addition circuit for adding the control signals generated by the control means with the cross-talk compensation component signals generated by the compensation component generation circuit; said compensation component generation circuit for each one of said plurality of channels includes a unit compensation circuit for each remaining channel other than said each one of said plurality of channels which constructs each cross-talk compensation signal for the cross-talk due to said each remaining channel; and said unit compensation circuit for said each remaining channel includes:

a first gain circuit for applying a gain control operation on one of the control signals for said each remaining channel;

an exponential circuit for applying an exponential operation on an output of the first gain circuit;

a differentiation circuit for differentiating an output of the exponential circuit;

a decay circuit for applying a decay operation on an output of the differentiation circuit;

an inversion circuit for inverting an output of the decay circuit; and a second gain circuit for applying another gain control operation on said one of the control signals for said each remaining channel, where a sum of an output of the inversion circuit and an output of the second gain circuit constitutes said each cross-talk compensation component signal for said each remaining channel.

2. The apparatus of claim 1, wherein a gain factor of the gain control operation to be applied by the first gain circuit is set according to an initial peak amplitude of each cross-talk component waveform for said each remaining channel, a gain factor of the gain control operation to be applied by the second gain circuit is set according to an offset of said each cross-talk component waveform for said each remaining channel, an exponential factor of the exponential operation to be applied by the exponential circuit is set according to an other channel dependency factor of said each cross-talk component waveform for said each remaining channel, and a decaying factor of the decay operation to be applied by the decay circuit is set according to a decaying time constant of said each cross-talk component waveform for said each remaining channel.

3. An apparatus for generating magnetic fields for a nuclear magnetic resonance imaging, comprising:

coil means having a plurality of channels for generating magnetic fields;

power source means for supplying currents to drive the coil means;

controller means for generating control signals indicating desired currents to be supplied from the power source means to the coil means in an absence of cross-talks among said plurality of channels of the coil means;

compensation circuit for compensating for the cross-talks among said plurality of channels of the coil means by supplying the power source means with cross-talk compensated control signals for controlling the currents to be supplied from the power source means to the coil means, the cross-talk compensated control signals being obtained by adding the control signals generated by the control means with cross-talk compensation component signals derived according to predetermined cross-talk characteristics of said plurality of channels of the coil means;

said compensation circuit including a compensation component generation circuit for generating the cross-talk compensation component signals by obtaining an inversion of cross-talk component waveforms for the cross-talks among said plurality of channels of the coil means measured in advance;

an addition circuit for adding the control signals generated by the control means with the cross-talk compensation component signals generated by the compensation component generation circuit;

said compensation component generation circuit for each one of said plurality of channels includes a unit compensation circuit for each remaining channel other than said each one of said plurality of channels which constructs each cross-talk compensation signal for the cross-talk due to said each remaining channel; and said unit compensation circuit for said each remaining channel including:
- a first gain circuit for applying a gain control operation on one of the control signals for said each remaining channel;
- a differentiation circuit for differentiating said one of the control signals for said each remaining channel to obtain a trigger signal;
- a memory for storing in digital form each cross-talk component waveform for said each remaining channel measured in advance;
- a D/A converter for D/A converting the cross-talk component waveform read out from the memory at a timing of the trigger signal;
- a multiplication circuit for multiplying an output of the first gain circuit with the D/A converted cross-talk component waveform obtained by the D/A converter;
- an inversion circuit for inverting an output of the multiplication circuit; and
- a second gain circuit for applying another gain control operation on said one of the control signals for said each remaining channel, where a sum of an output of the inversion circuit and an output of the second gain circuit constitutes said each cross-talk compensation component signal for said each remaining channel.

4. An apparatus for generating magnetic fields for a nuclear magnetic resonance imaging, comprising:

coil means having a plurality of channels for generating magnetic fields;

power source means for supplying currents to drive the coil means;

controller means for generating control signals indicating desired currents to be supplied from the power source means to the coil means in an absence of cross-talks among said plurality of channels of the coil means;

compensation circuit for compensating for the cross-talks among said plurality of channels of the coil means by supplying the power source means with cross-talk compensated control signals for controlling the currents to be supplied from the power source means to the coil means, the cross-talk compensated control signals being obtained by adding the control signals generated by the control means with cross-talk compensation component signals derived according to predetermined cross-talk characteristics of said plurality of channels of the coil means;

said compensation circuit including a compensation component generation circuit for generating the cross-talk compensation component signals by obtaining an inversion of cross-talk component waveforms for the cross-talks among said plurality of channels of the coil means measured in advance;

an addition circuit for adding the control signals generated by the control means with the cross-talk compensation component signals generated by the compensation component generation circuit;

said compensation component generation circuit for each one of said plurality of channels includes a unit compensation circuit for each remaining channel other than said each one of said plurality of channels which constructs each cross-talk compensation signal for the cross-talk due to said each remaining channel; and said unit compensation circuit for said each remaining channel including:
- a first gain circuit for applying a gain control operation on one of the control signals for said each remaining channel;
- a differentiation circuit for differentiating said one of the control signals for said each remaining channel to obtain a trigger signal;
- a memory for storing in digital form an inversion of each cross-talk component waveform for said each remaining channel measured in advance;
- a D/A converter for D/A converting the cross-talk component waveform read out from the memory at a timing of the trigger signal;
- a multiplication circuit for multiplying an output of the first gain circuit with the D/A converted cross-talk component waveform obtained by the D/A converter; and
- a second gain circuit for applying another gain control operation on said one of the control signals for said each remaining channel, where a sum of an output of the multiplication circuit and an output of the second gain circuit constitutes said each cross-talk compensation component signal for said each remaining channel.

5. An apparatus for generating magnetic fields for a nuclear magnetic resonance imaging, comprising:

coil means having a plurality of channels for generating magnetic fields;

power source means for supplying currents to drive the coil means;

controller means for generating control signals indicating desired currents to be supplied from the power source means to the coil means in an absence of cross-talks among said plurality of channels of the coil means;

compensation circuit for compensating for the cross-talks among said plurality of channels of the coil means by supplying the power source means with cross-talk compensated control signals for controlling the currents to be supplied from the power source means to the coil means, the cross-talk compensated control signals being obtained by adding the control signals generated by the control means with cross-talk compensation component signals derived according to predetermined cross-talk characteristics of said plurality of channels of the coil means;

said compensation circuit including a compensation component generation circuit for generating the cross-talk compensation component signals by obtaining an inversion of cross-talk component waveforms for the cross-talks among said plurality of channels of the coil means measured in advance;

an addition circuit for adding the control signals generated by the control means with the cross-talk compensation component signals generated by the compensation component generation circuit; and said compensation component generation circuit for each one of said plurality of channels including a memory for each remaining channel other than said each one of said plurality of channels which stores each cross-talk compensation component signal for said each remaining channel determined in advance.

6. The apparatus of claim 1, wherein the coil means includes at least one of gradient magnetic field coils, shim coils, and a static magnetic field coil for the nuclear magnetic resonance imaging.

7. The apparatus of claim 1, wherein the compensation circuit for said each remaining channel has circuit parameters adjusted according to the cross-talk component waveforms for the cross talks among said plurality of channels of the coil means measured in advance.

8. The apparatus of claim 3, wherein the coil means includes at least one of gradient magnetic field coils, shim coils, and a static magnetic field coil for the nuclear magnetic resonance imaging.

9. The apparatus of claim 3, wherein the compensation circuit for said each remaining channel has circuit parameters adjusted according to the cross-talk component waveforms for the cross talks among said plurality of channels of the coil means measured in advance.

10. The apparatus of claim 4, wherein the coil means includes at least one of gradient magnetic field coils, shim coils, and a static magnetic field coil for the nuclear magnetic resonance imaging.

11. The apparatus of claim 4, wherein the compensation circuit for said each remaining channel has circuit parameters adjusted according to the cross-talk component waveforms for the cross talks among said plurality of channels of the coil means measured in advance.

12. The apparatus of claim 5, wherein the coil means includes at least one of gradient magnetic field coils, shim coils, and a static magnetic field coil for the nuclear magnetic resonance imaging.

13. The apparatus of claim 5, wherein the compensation component generation circuit for each one of said plurality of channels includes a unit compensation circuit for each remaining channel other than said each one of said plurality of channels which constructs each cross-talk compensation signal for the cross-talk due to said each remaining channel.

14. The apparatus of claim 13, wherein the compensation circuit for said each remaining channel has circuit parameters adjusted according to the cross-talk component waveforms for the cross-talks among said plurality of channels of the coil means measured in advance.

* * * * *